(12) United States Patent
Wu (10) Patent No.: US 8,384,445 B2
(45) Date of Patent: Feb. 26, 2013

(54) DRIVING STAGE AND RELATED DRIVING METHOD

(75) Inventor: Chien-Hua Wu, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/004,903

(22) Filed: Jan. 12, 2011

(65) Prior Publication Data

US 2012/0176163 A1   Jul. 12, 2012

(51) Int. Cl.
   *H03K 3/00*   (2006.01)
(52) U.S. Cl. ............................. 327/108; 326/86; 326/83
(58) Field of Classification Search .................... None
   See application file for complete search history.

(56) References Cited

U.S. PATENT DOCUMENTS

| | | | | |
|---|---|---|---|---|
| 5,546,021 A | * | 8/1996 | Bizuneh et al. | 326/86 |
| 6,411,146 B1 | * | 6/2002 | Kuo | 327/198 |
| 6,525,559 B1 | * | 2/2003 | Wu et al. | 326/30 |
| 7,253,663 B2 | * | 8/2007 | Cho et al. | 326/115 |
| 7,898,295 B1 | * | 3/2011 | Kasturirangan et al. | 326/86 |

OTHER PUBLICATIONS

"Design of the Power Sense of TMDS", Inventor: Chong Hua-ming, Dai Qing-yuan, Feb. 2008.

* cited by examiner

*Primary Examiner* — Shawki S. Ismail
*Assistant Examiner* — Crystal L Hammond
(74) *Attorney, Agent, or Firm* — Winston Hsu; Scott Margo (57) ABSTRACT

A driving stage of a signal transmitting system includes: a driver powered by a first supply source and arranged to output a driving signal via an output port capable of being connected to an external device; and a controllable isolating circuit including: a switching circuit arranged to selectively couple the first supply source to the output port, and a detecting circuit arranged to detect a specific signal derived from the signal transmitting system, wherein when the specific signal indicates the signal transmitting system turns into a power-off state, the detecting circuit controls the switching circuit to disconnect the output port from the first supply source.

27 Claims, 8 Drawing Sheets

FIG. 8

DRIVING STAGE AND RELATED DRIVING METHOD

BACKGROUND

The present invention relates to a driving stage and a related driving method for the driving stage, and more particularly to a driving stage having a controllable isolating circuit, and a related driving method.

A Transition Minimized Differential Signaling (TMDS) driver is employed to transmit high-speed serial data conforming to the Digital Visual Interface (DVI) specification or High Definition Multimedia Interface (HDMI) specification to an output device, such as a full HD (High Definition) television. In addition, the Transition Minimized Differential Signaling driver generates high-speed serial data to the full HD television via a differential cable. Since the differential cable may be constantly connected between the Transition Minimized Differential Signaling driver and the full HD television, a leakage current generated from the output device may be injected to the Transition Minimized Differential Signaling driver via the differential cable under some circumstances. For example, when the full HD television is powered on (in operation) and the Transition Minimized Differential Signaling driver is powered off, this may induce injection of a leakage current of the output device into the Transition Minimized Differential Signaling driver via the differential cable. This may result in the control circuit of the TMDS driver being incorrectly activated by the leakage current where the control circuit should be in the power-off state. Therefore, providing an efficient and inexpensive way to save the power of the full HD television and to avoid the erroneous activation of the control circuit is a significant concern in the high definition television field.

SUMMARY OF THE INVENTION

One of the objectives of the present invention is to therefore provide a driving stage having a controllable isolating circuit, and a related driving method.

According to a first embodiment of the present invention, a driving stage of a signal transmitting system is disclosed. The driving stage comprises a driver and a controllable isolating circuit. The driver is powered by a first supply source and arranged to output a driving signal via an output port capable of being connected to an external device. The controllable isolating circuit comprises a switching circuit and a detecting circuit. The switching circuit is arranged to selectively couple the first supply source to the output port. The detecting circuit is arranged to detect a specific signal derived from the signal transmitting system, wherein when the specific signal indicates the signal transmitting system turns into a power-off state, the detecting circuit controls the switching circuit to disconnect the output port from the first supply source.

According to a second embodiment of the present invention, a driving stage is disclosed. The driving stage comprises a driver and a controllable isolating circuit. The driver is powered by a first supply source and arranged to output a driving signal via an output port. The controllable isolating circuit is capable of interrupting a conducting path between the first supply source and the output port under a condition where a power powered by the first supply source is lower than a power level indicative of the driver turns into a power-off state, wherein the driver and the controllable isolating circuit are disposed in a same chip.

According to a third embodiment of the present invention, a driving method for a driving stage of a signal transmitting system is disclosed, wherein the driving stage comprises a driver powered by a first supply source. The driving method comprises: arranging the driver to output a driving signal via an output port capable of being connected to an external device; selectively coupling the first supply source to the output port through a switching circuit; and detecting a specific signal derived from the signal transmitting system, wherein when the specific signal indicates the signal transmitting system turns into a power-off state, controlling the switching circuit to disconnect the output port from the first supply source.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
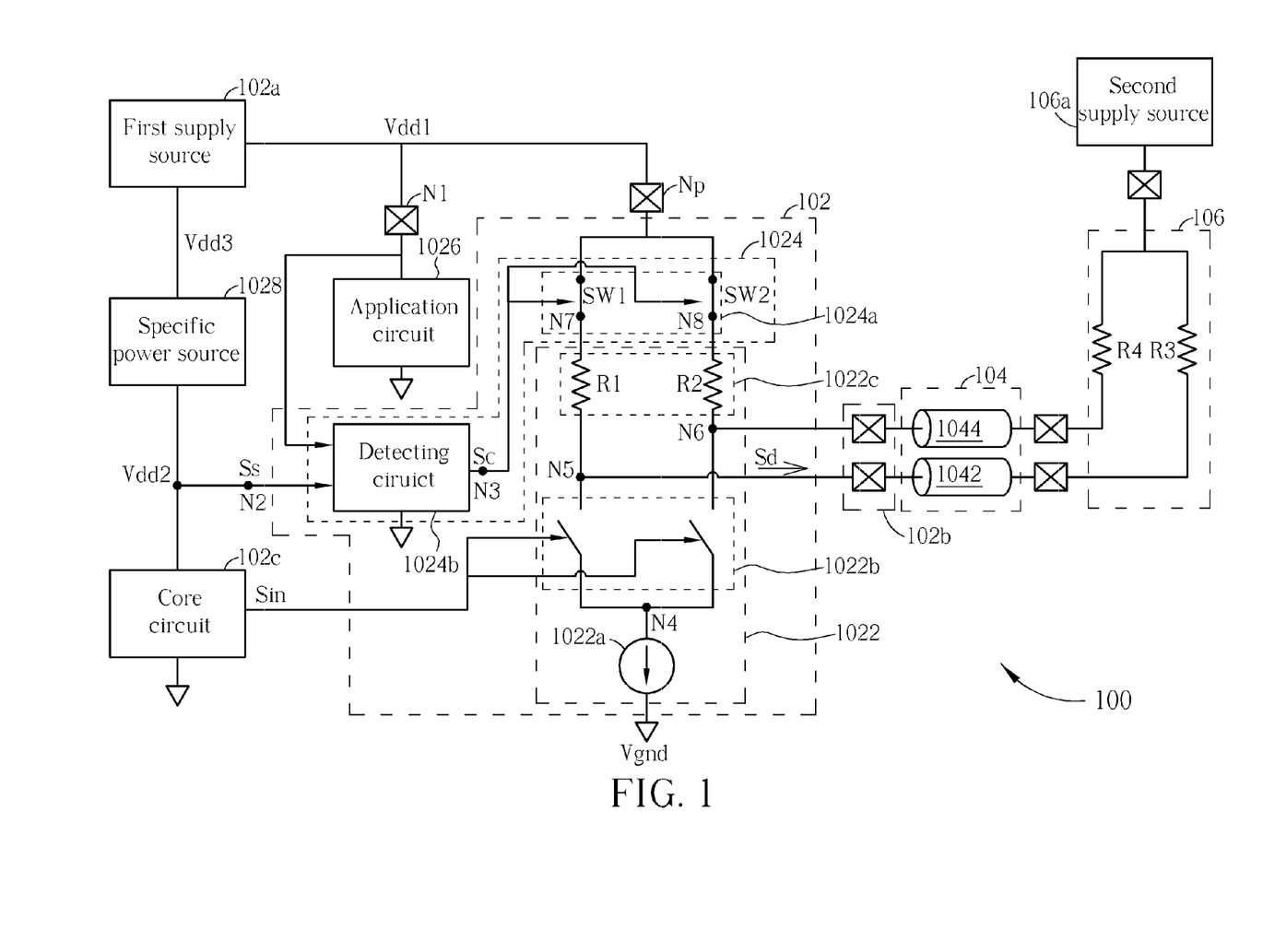
FIG. 1 is a diagram illustrating a signal transmitting system according to a first embodiment of the present invention.

FIG. 1 is a diagram illustrating a signal transmitting system 100 according to an embodiment of the present invention. The signal transmitting system 100 comprises a driving stage 102, a cable system 104, and a receiving stage 106. The driving stage 102 comprises a driver 1022 and a controllable isolating circuit 1024. The driver 1022 is powered by a first supply source 102a and arranged to output a driving signal Sd via an output port 102b capable of being connected to an external device (e.g., the receiving stage 106), wherein the driving signal Sd corresponds to an input signal Sin generated from a core circuit 102c. The controllable isolating circuit 1024 is capable of interrupting a conducting path between the first supply source 102a and the output port 102b under a condition where a power powered by the first supply source 102a is lower than a power level indicative of the driver turns into a power-off state. More specifically, the controllable isolating circuit 1024 is capable of being powered by an external signal Sx received from the external device through the output port 102b, and when the controllable isolating circuit 1024 is powered by the external signal Sx, the controllable isolating circuit 1024 detects a specific signal (i.e., Ss) derived from the signal transmitting system 100 to determine if the signal transmitting system 100 turns into the power-off state, wherein when the specific signal indicates the signal transmitting system 100 turns into the power-off state, the controllable isolating circuit 1024 disconnects the output port 102b from the first supply source 102a. It should be noted that the power-off state may be the sleep-mode state, the low-power state, standby mode state, or any other state known in the art that in which the driver 1022 is not being activated.

The receiving stage 106 is powered by a second supply source 106a distinct from the first supply source 102a. The controllable isolating circuit 1024 comprises a switching circuit 1024a and a detecting circuit 1024b. The switching circuit 1024a is arranged to selectively couple the first supply source 102a to the output port 102b. The detecting circuit 1024b is arranged to detect the specific signal Ss derived from the signal transmitting system 100, wherein when the specific signal Ss indicates the signal transmitting system 100 turns into the power-off state, the detecting circuit 1024b controls the switching circuit 1024a to disconnect the output port 102b from the first supply source 102a. In other words, the switching circuit 1024a is arranged to selectively disconnect or connect the conducting path between the first supply source 102a and the output port 102b according to a control signal Sc. The detecting circuit 1024b is arranged to generate the control signal Sc to the switching circuit 1024a according to the first supply source 102a and the external signal Sx. More specifically, the detecting circuit 1024b generates the control signal Sc to switch off the switching circuit 1024a when the first supply source 102a is powered off (e.g., the power powered by the first supply source 102a lower than the power level) and when the detecting circuit 1024b is powered by the external signal Sx received from the output port 102b. It should be noted that the conducting path between the output port 102b and the first supply source 102a is not disconnected right after the first supply source 102a turns into the power-off state, the conducting path between the output port 102b and the first supply source 102a could be interrupted by switching off or disconnecting the switching circuit 1024a during the first supply source 102a turns into the power-off state and the detecting circuit 1024b is powered by the external signal Sx.

More specifically, the driver 1022 is coupled to the first supply source 102a via a power supply node Np of the driving stage 102, wherein the power supply node Np can be a power pad as shown in FIG. 1. The detecting circuit 1024b has a first input node N1 coupled to the power supply node Np, a second input node N2 receiving the specific signal Ss indicative of an operational status of the first supply source 102a, and an output node N3 coupled to the switching circuit 1024a for outputting the control signal Sc. Please note that, in this embodiment, the first input node N1 of the detecting circuit 1024b can also be a power pad as shown in FIG. 1, wherein another application circuit 1026 may be arranged to receive the power of the first supply source 102a via the first input node N1, and a power line is coupled between the first input node N1 and the power supply node Np.

In practice, the driver 1022 can be a Transition Minimized Differential Signaling (TMDS) driver, and the cable system 104 comprises a differential cable consisting of a first cable 1042 and a second cable 1044 coupled between the driver 1022 and the receiving stage. The receiving stage 106 can be a display system, such as a full HD (High Definition) television.

In addition, according to the first embodiment as shown in FIG. 1, the core circuit 102c is powered by a specific power source 1028 which is also derived from the first supply source 102a. For example, the first output voltage of the first supply source 102a is Vdd1, the second output voltage of the first supply source 102a is Vdd3, and the specific power source 1028 may be a low dropout regulator that generates the output voltage of Vdd2 according to the second output voltage Vdd3, wherein the first output voltage Vdd1 may or may not equal the second output voltage Vdd3. However, in this embodiment, the first output voltage Vdd1 is set to equal to the second output voltage Vdd3 for brevity. Therefore, when the first supply source 102a is powered off, the specific power source 1028 is also powered off. In other words, when the first supply source 102a is powered off, the voltage level of the output voltage Vdd2 of the specific power source 1028 will decrease gradually to reach the ground voltage.

In the first embodiment as shown in FIG. 1, the driver 1022 comprises a current source 1022a, an input circuit 1022b, and a matching circuit 1022c. The current source 1022a has a first node coupled to the ground voltage Vgnd as shown in FIG. 1. The input circuit 1022b has a first node N4 coupled to a second node of the current source 1022a, and a second node N5 and a third node N6 coupled to a first node and a second node of the output port 102b, respectively, in which the output port 102b comprises two data ports coupled to the first cable 1042 and the second cable 1044 respectively for outputting the differential driving signal Sd. The matching circuit 1022c has a first node and a second node coupled to the second node N5 and the third node N6 of the input circuit 1022b, respectively. It should be noted that the input circuit 1022b is a differential input pair circuit comprising two switches for receiving the differential input signal Sin to generate the differential driving signal Sd. The matching circuit 1022c also comprises two resistors R1, R2 coupled to the second node N5 and the third node N6 respectively for performing an impedance matching at the output port 102b. Furthermore, for simplicity, the receiving stage 106 is indicated by two resistors R3, R4 coupled between the cable system 104 (i.e., the first cable 1042 and the second cable 1044 respectively) and the second supply source 106a.

In addition, the switching circuit 1024a comprises a first switch SW1 and a second switch SW2. The first switch SW1 has a first node N7 coupled to a third node of the matching circuit, i.e., a node of the first resistor, a second node coupled to the power supply node Np, and a control node coupled to the output node N3 of the detecting circuit 1024b, wherein the first switch SW1 is arranged to selectively connect the first node N7 of the first switch SW1 to the second node of the first switch SW1 or disconnect the first node N7 of the first switch SW1 from the second node of the first switch SW1 according to the control signal Sc. The second switch SW2 has a first node N8 coupled to a fourth node of the matching circuit, i.e., a node of the second resistor, a second node coupled to the power supply node Np, and a control node coupled to the output node N3 of the detecting circuit 1024b, wherein the second switch SW2 is arranged to selectively connect the first node N8 of the second switch SW2 to the second node of the second switch SW2 or disconnect the first node N8 of the second switch SW2 from the second node of the second switch SW2 according to the control signal Sc.

Figure 2:
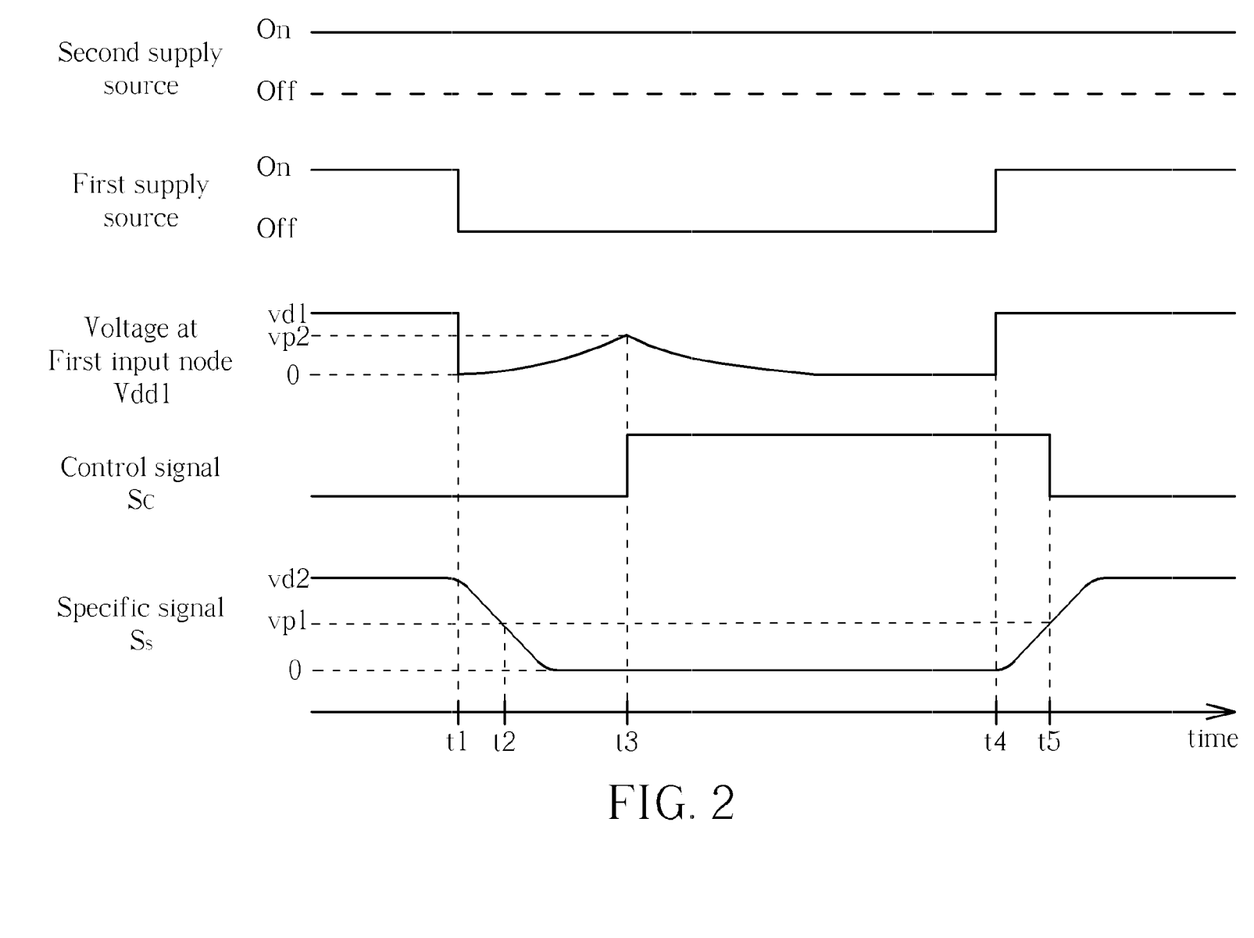
FIG. 2 is a timing diagram illustrating statuses of a second supply source, a first supply source, the voltage at a first input node, a specific signal, and a control signal according to an embodiment of the present invention.

FIG. 2 is a timing diagram illustrating the statuses of the second supply source 106a and the first supply source 102a, the voltage at the first input node N1, the specific signal Ss, and the control signal Sc according to an embodiment of the present invention. When the driving stage 102 is powered by the first supply source 102a, the driving stage 102 is arranged to receive the input signal Sin to generate the driving signal Sd in a driving state. When the driving stage 102 is in the driving state, the first node N7 of the first switch SW1 should be connected to the second node of the first switch SW1, and the first node N8 of the second switch SW2 should be connected to the second node of the second switch SW2 such that the power generated by the first supply source 102a can activate the driving stage 102. Therefore, in an example of this embodiment, the specific signal Ss is set to be the output voltage Vdd2 generated by the specific power source 1028, and the detecting circuit 1024b detects the voltage level of the output voltage Vdd2 to determine the status (i.e., power-on or power-off) of the signal transmitting system 100. It should be noted that the detecting circuit 1024b is powered by the voltage (i.e., Vdd1) at the first input node N1. More specifically, the voltage at the first input node N1 equals a high voltage level (e.g, vd1 in FIG. 2) when the first supply source 102a is powered on, and the specific signal Ss also equals another high voltage level (e.g., vd2 in FIG. 2) when the specific power source 1028 is powered on as shown in the time interval before the time t1 in FIG. 2. Therefore, when the detecting circuit 1024b detects that the voltage level of the specific signal Ss is the high voltage level, i.e., vd2, the detecting circuit 1024b generates the control signal Sc to switch on the first switch SW1 and the second switch SW2. It should be noted that, in this preferred embodiment, the first switch SW1 and the second switch SW2 are implemented by two P-type field-effect transistors respectively, therefore the voltage level of the control signal Sc is the low voltage level before the time t3 for switching on the two P-type field-effect transistors. Accordingly, the input circuit 1022b drives the input signal Sin generated from the core circuit 102c to the receiving stage 106, which is powered by the second supply source 106a, via the first cable 1042 and the second cable 1044. It should be noted that the voltage level vd2 may not be the same as the voltage level vd1. For example, the voltage level vd2 may be smaller than the voltage level vd1 in an embodiment.

When the first supply source 102a is powered off, for example, along with the signal transmitting system 100 is turned off, at time t1 and the receiving stage 106 still keeps being powered by the second supply source 106a, the voltage level at the first input node N1 is moving to the ground voltage right after time t1, and the output voltage Vdd2 of the specific power source 1028, i.e., the specific signal Ss, decreases gradually after time t1 since the first supply source 102a stops to supply power to the specific power source 1028. At time t2, the voltage level of the specific signal Ss reaches the predetermined voltage level (i.e., vp1 in FIG. 2). As the second supply source 106a is still powered on and the first cable 1042 and the second cable 1044 are still coupled between the driving stage 102 and the receiving stage 106, a leakage current (i.e., the external signal Sx) is induced by a significant voltage difference between the first supply source 102a and the second supply source 106a, flowing from the second supply source 106a to the power supply node Np via the cable system 104, the matching circuit 1022c, and the switching circuit 1024a as shown in FIG. 1. As the power supply node Np is connected to the first input node N1, the voltage level at the first input node N1 starts to resume raising after the falling due to the power off of the first supply source 102a.

To avoid the leakage current flowing into the application circuit 1026 when the first supply source 102a is powered off, the conducting path between the first supply source 102a and the output port 102b should be disconnected. Therefore, according to an embodiment of the present invention, when the voltage level at the first input node N1 reaches a predetermined voltage level vp2, the detecting circuit 1024b gets enough power to output the control signal Sc, e.g., of the high voltage level, thus switching off the switching circuit 1024a to disconnect the conducting path between the first supply source 102a and the output port 102b at time t3.

Figure 3:
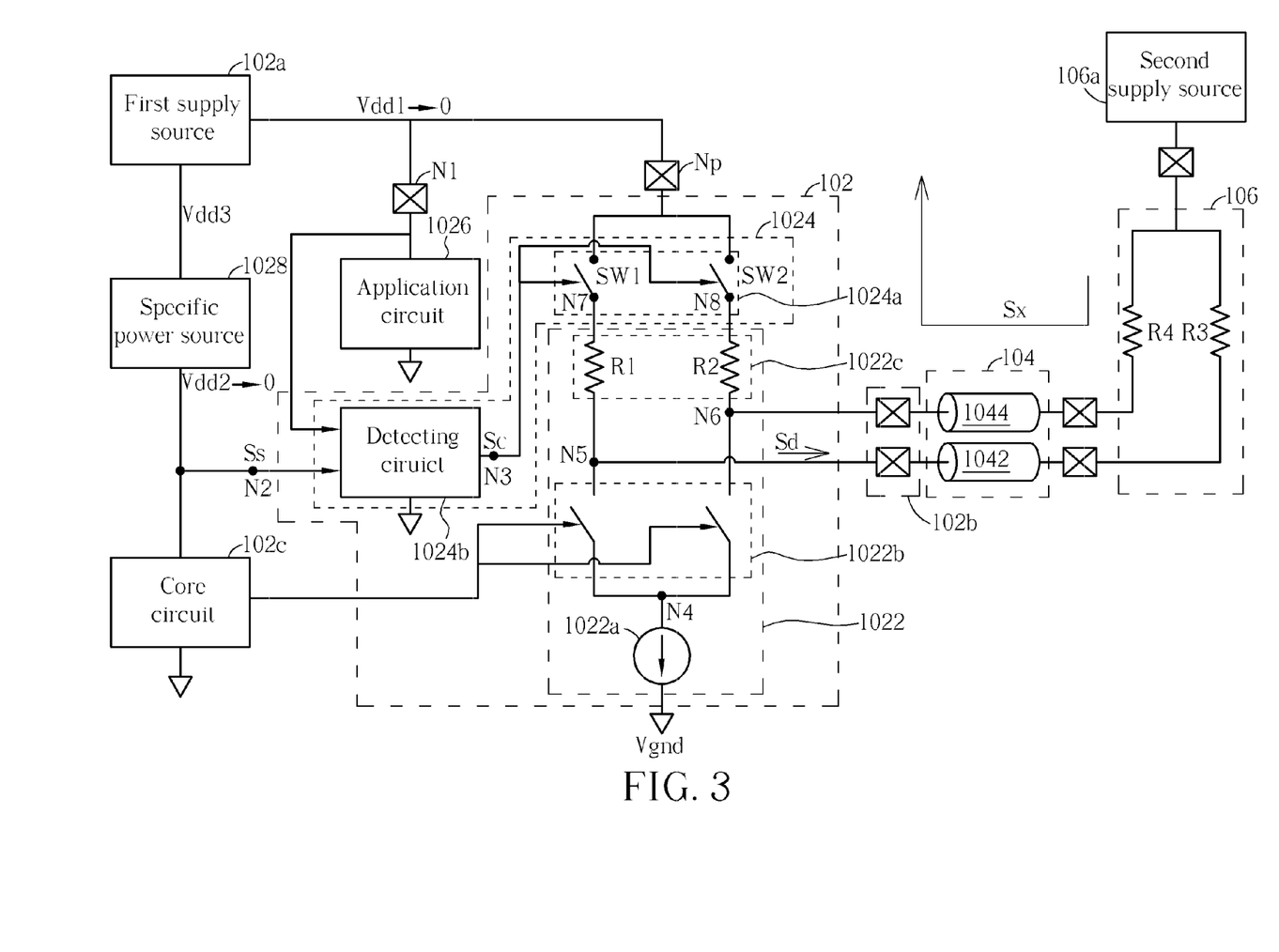
FIG. 3 is a diagram illustrating the signal transmitting system when the conducting path between the first supply source and an output port is disconnected.

FIG. 3 is a diagram illustrating the signal transmitting system 100 when the conducting path between the first supply source 102a and the output port 102b is disconnected. Therefore, when the voltage level at the second input node N2 is at the low voltage level and the voltage level at the first input node N1 reaches the predetermined voltage level vp2, the detecting circuit 1024b determines that the external signal Sx is leaked into the driving stage 102 from the second supply source 106a, and therefore the detecting circuit 1024b generates the control signal Sc to disconnect the conducting path between the first supply source 102a and the output port 102b. As a result, the external signal Sx is blocked from the application circuit 1026, and the voltage level at the first input node N1 will be reduced gradually to the ground voltage after time t3 as shown in FIG. 2. It should be noted that after the time t3, the detecting circuit 1024b is powered off, and the conducting path between the first supply source 102a and the output port 102b is kept disconnected after time t3.

When the first supply source 102a is powered on again in time t4, for example, along with the signal transmitting system 100 is turned on, the voltage levels at the first input node N1 and the power supply node Np are shifted to the high voltage level vd1 once more, and the voltage level of the voltage level of the output voltage Vdd2 increases gradually. It should be noted that the detecting circuit 1024b is powered by the first supply source 102a at time t4. At time t5, when the voltage level of the output voltage Vdd2 reaches the predetermined voltage level vp1, the detecting circuit 1024b acknowledges that the specific power source 1028 is powered on, and therefore the detecting circuit 1024b generates the control signal Sc, e.g., of the low voltage level, switching on the switching circuit 1024a to connect the conducting path between the first supply source 102a and the output port 102b again as shown in FIG. 1.

Furthermore, it should be noted that the driver 1022 and the controllable isolating circuit 1024 are disposed in a same chip according to an embodiment of the present invention. More specifically, in this embodiment, the driver 1022, the controllable isolating circuit 1024, the application circuit 1026, the specific power source 1028, and the core circuit 102c are disposed in the same chip which has the advantages of reducing the cost of fabrication. In other words, the controllable isolating circuit 1024 is an internal circuit of the driving stage 102 rather than an external circuit externally coupled to the power line between the first input node N1 and the power supply node Np.

Figure 4:
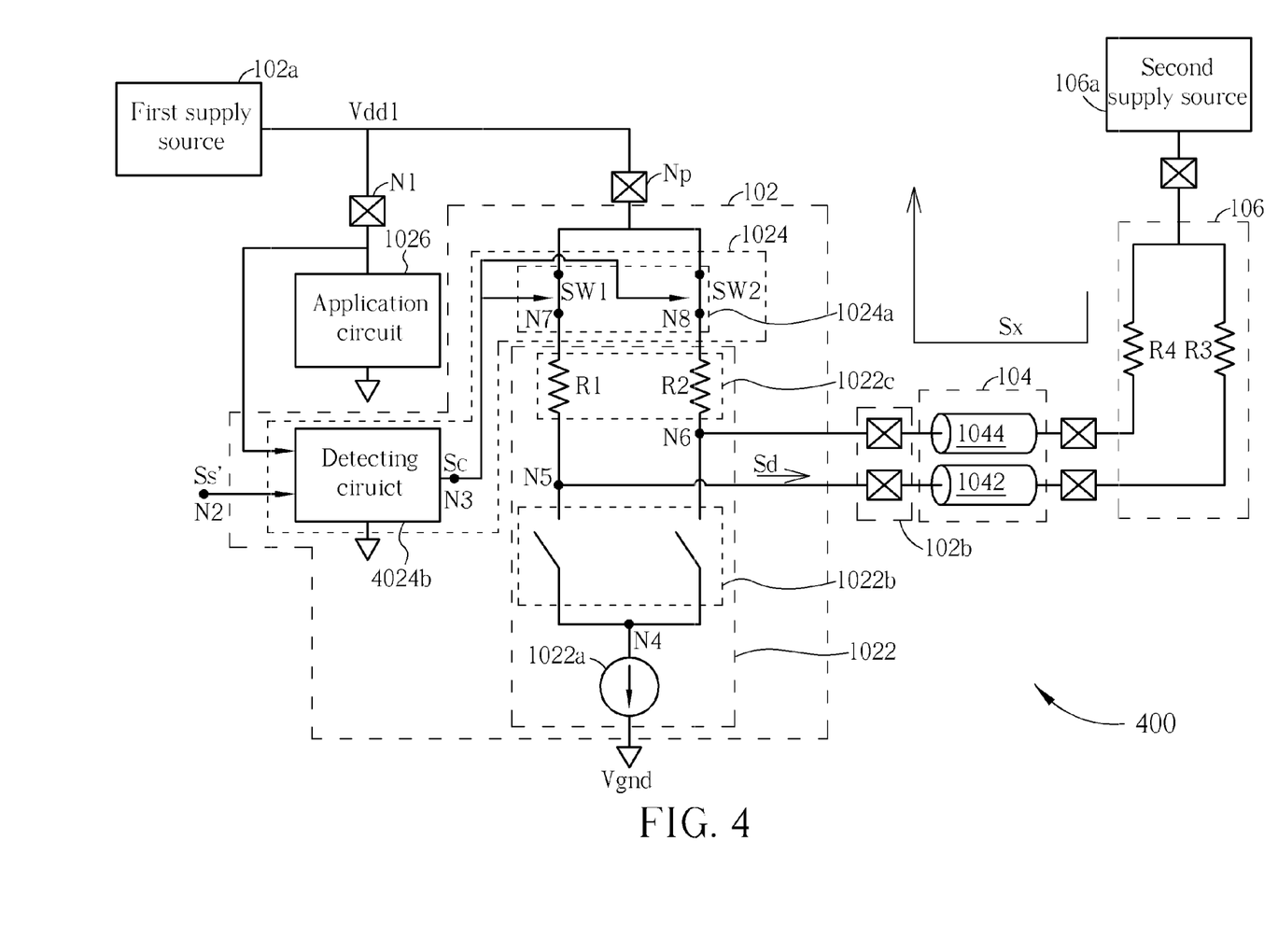
FIG. 4 is a diagram illustrating a signal transmitting system according to a second embodiment of the present invention.

In addition, it should also be noted that, even though the detecting circuit 1024b in the first embodiment shown in FIG. 1 detects the output voltage of the specific power source 1028 to determine the status (i.e., power-on or power-off) of the signal transmitting system 100, this is not the limitation of the present invention. Any other signal or voltage other than the voltages at the first input node N1 and the power supply node Np that are capable of indicating the status (i.e., power-on or power-off) of signal transmitting system 100 also can belong to the scope of the present invention as shown in FIG. 4. FIG. 4 is a diagram illustrating a signal transmitting system 400 according to a second embodiment of the present invention. Please note that, except for the detecting circuit 4024b, the signal transmitting system 400 has components similar to the signal transmitting system 100, and the components in the signal transmitting system 400 that are labeled with the same numeral as the components in the signal transmitting system 100 also possess similar functions to the corresponding components in the signal transmitting system 100. The detailed description is therefore omitted here for brevity. According to the signal transmitting system 400, the second input node N2 of the detecting circuit 4024b is coupled to any signal or voltage that is capable of indicating the status (i.e., power-on or power-off) of the signal transmitting system 100. In other words, the specific signal Ss' in the signal transmitting system 400 is any signal or voltage that is capable of indicating the status of the signal transmitting system 100. For example, the specific signal Ss' is the divided voltage derived from the output voltage of the first supply source 102a since the divided voltage can indicate the status of the signal transmitting system 100.

Figure 5:
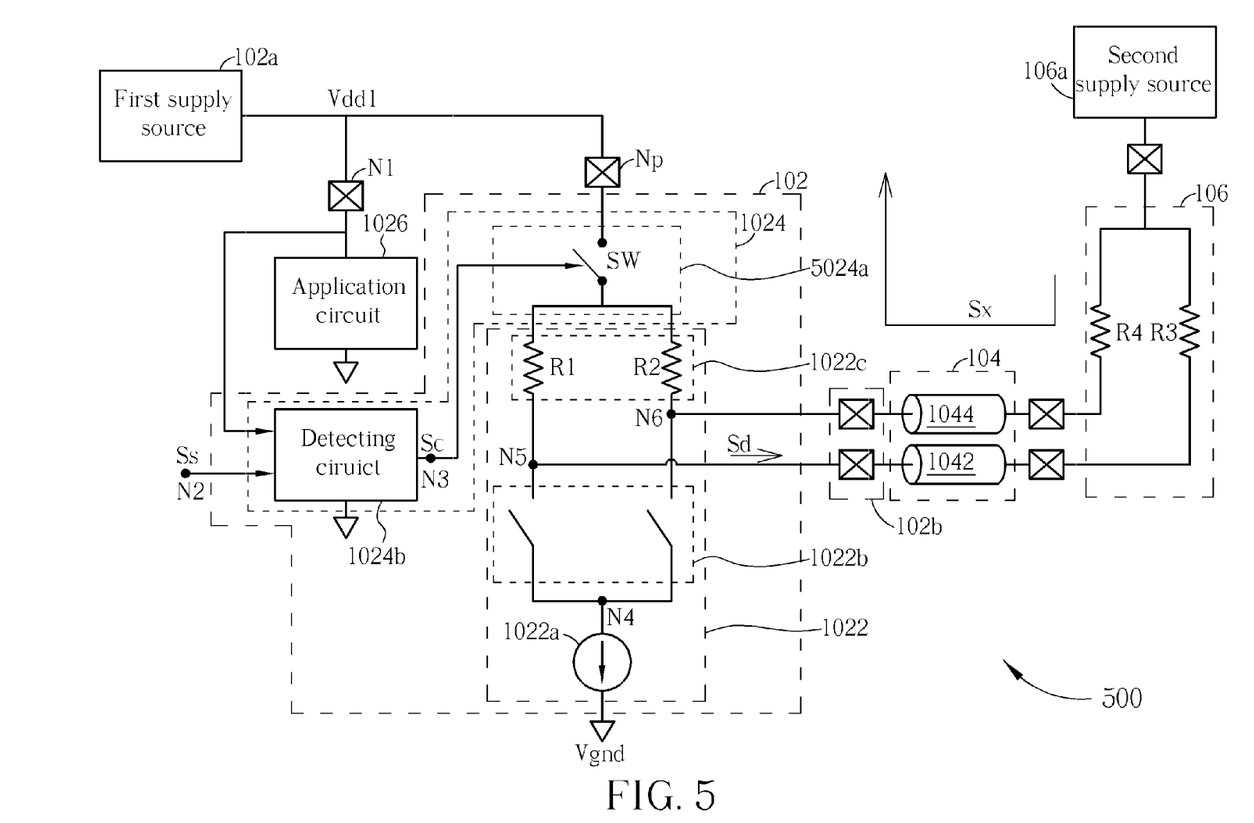
FIG. 5 is a diagram illustrating a signal transmitting system according to a third embodiment of the present invention.

Furthermore, even though the switching circuit 1024a comprises two switches in the signal transmitting system 100, i.e., the first switch SW1 and the second switch SW2, this is not the limitation of the present invention. Any number of switches that are capable of selectively disconnecting or connecting the conducting path between the matching circuit 1022c and the power supply node Np also belong to the scope of the present invention as shown in FIG. 5. FIG. 5 is a diagram illustrating a signal transmitting system 500 according to a third embodiment of the present invention. Except for the switching circuit 5024a, the signal transmitting system 500 has components similar to the signal transmitting system 100, and the components in the signal transmitting system 500 that are labeled with the same numeral as the components in the signal transmitting system 100 also possess similar functions to the corresponding components in the signal transmitting system 100. The detailed description is therefore omitted here for brevity.

According to the signal transmitting system 500, the switching circuit 5024a comprises only one switch SW coupled between the matching circuit 1022c and the power supply node Np. The switch SW is arranged to selectively disconnect or connect the conducting path between the matching circuit 1022c and the power supply node Np according to the control signal Sc.

Figure 6:
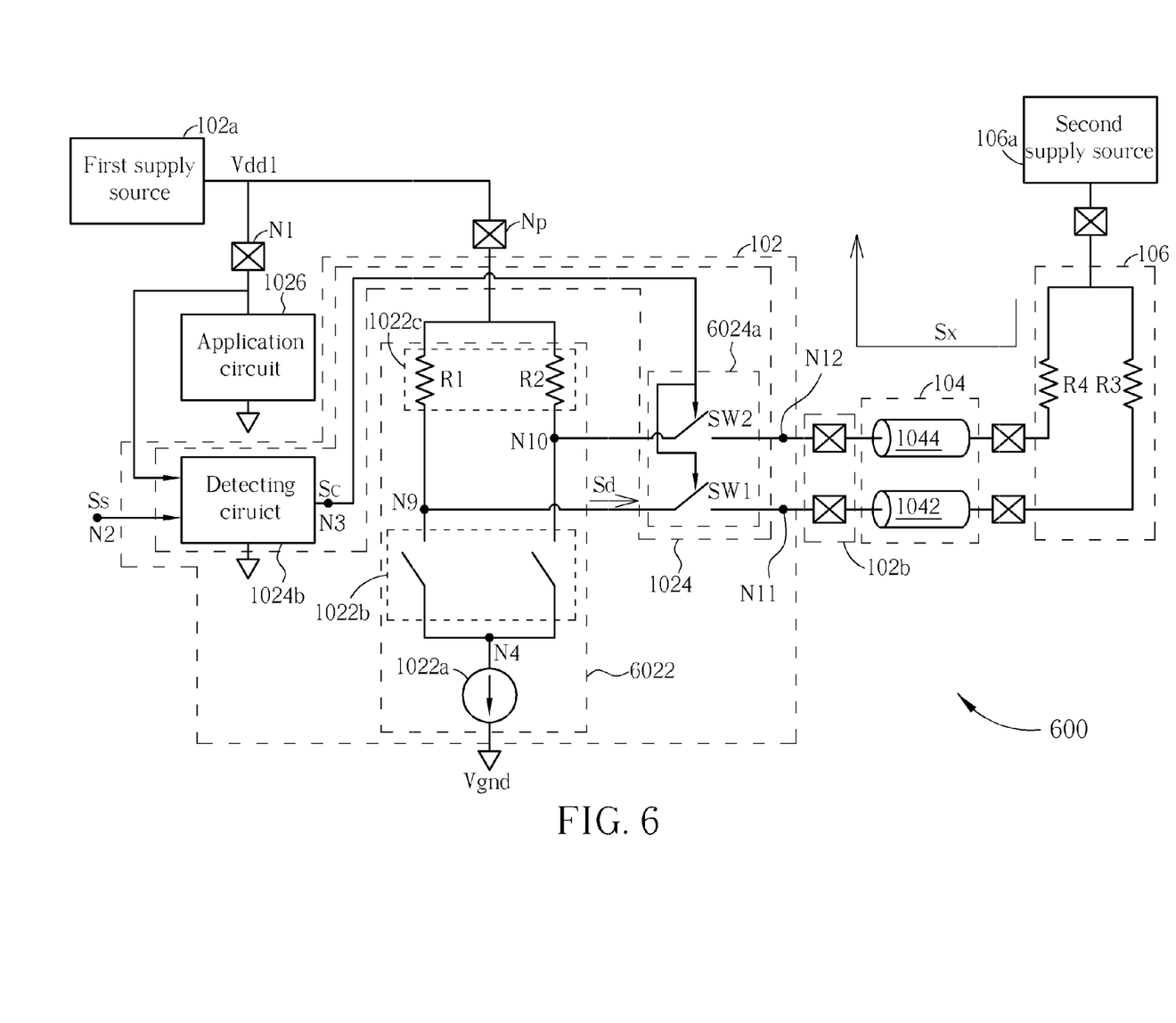
FIG. 6 is a diagram illustrating a signal transmitting system according to a fourth embodiment of the present invention.

Furthermore, it also should be noted that the switching circuit 1024a is not limited to the structural connectivity as recited in FIG. 1. The switching circuit 1024a can also be disposed in any other place between the first supply source 102a and the output port 102b to selectively disconnect or connect the conducting path between the first supply source 102a and the output port 102b according to the control signal Sc as shown in FIG. 6. FIG. 6 is a diagram illustrating a signal transmitting system 600 according to a fourth embodiment of the present invention. Please note that the signal transmitting system 600 has components similar to the signal transmitting system 100 except for the connecting relationship between the driver 6022 and the switching circuit 6024a. Therefore, the components in the signal transmitting system 600 that are labeled with the same numeral as the components in the signal transmitting system 100 possess similar functions to the corresponding components in the signal transmitting system 100. The detailed description is therefore omitted here for brevity.

According to the signal transmitting system 600, the driver 6022 also comprises the current source 1022a, the input circuit 1022b, and the matching circuit 1022c, and the switching circuit 6024a also comprises the first switch SW1 and the second switch SW2. The current source 1022a has a first node coupled to the ground voltage Vgnd. The input circuit 1022b has a first node coupled to a second node of the current source. The matching circuit 1022c has a first node N9 and a second node N10 coupled to a second node and a third node of the input circuit 1022b respectively, and a third node and a fourth node coupled to the power supply node Np. The first switch SW1 has a first node coupled to the first node N9 of the matching circuit 1022c, a second node coupled to a first node N11 of the output port 102b, and a control node coupled to the output node N3 of the detecting circuit 1024b, wherein the first switch SW1 is arranged to selectively connect the first node of the first switch SW1 to the second node of the first switch SW1 or disconnect the first node of the first switch SW1 from the second node of the first switch SW1 according to the control signal Sc. The second switch SW2 has a first node coupled to the second node N10 of the matching circuit 1022c, a second node coupled to a second node N12 of the output port 102b, and a control node coupled to the output node N3 of the detecting circuit 1024b, wherein the second switch SW2 is arranged to selectively connect the first node of the second switch SW2 to the second node of the second switch SW2 or disconnect the first node of the second switch SW2 from the second node of the second switch SW2 according to the control signal Sc.

Therefore, when the detecting circuit 1024b detects that the first supply source 102a is powered on, the detecting circuit 1024b generates the control signal Sc to switch on the first switch SW1 and the second switch SW2. When the first supply source 102a is powered off and the receiving stage 106 still keeps being powered by the second supply source 106a, and when the voltage level at the first input node N1 reaches the predetermined voltage level vp2, the detecting circuit 1024b gets enough power to output the control signal Sc to switch off the switching circuit 6024a to disconnect the conducting path between the first supply source 102a and the output port 102b. Therefore, the conducting path between the first supply source 102a and the output port 102b is disconnected, and the external signal Sx is blocked from the application circuit 1026.

Figure 7:
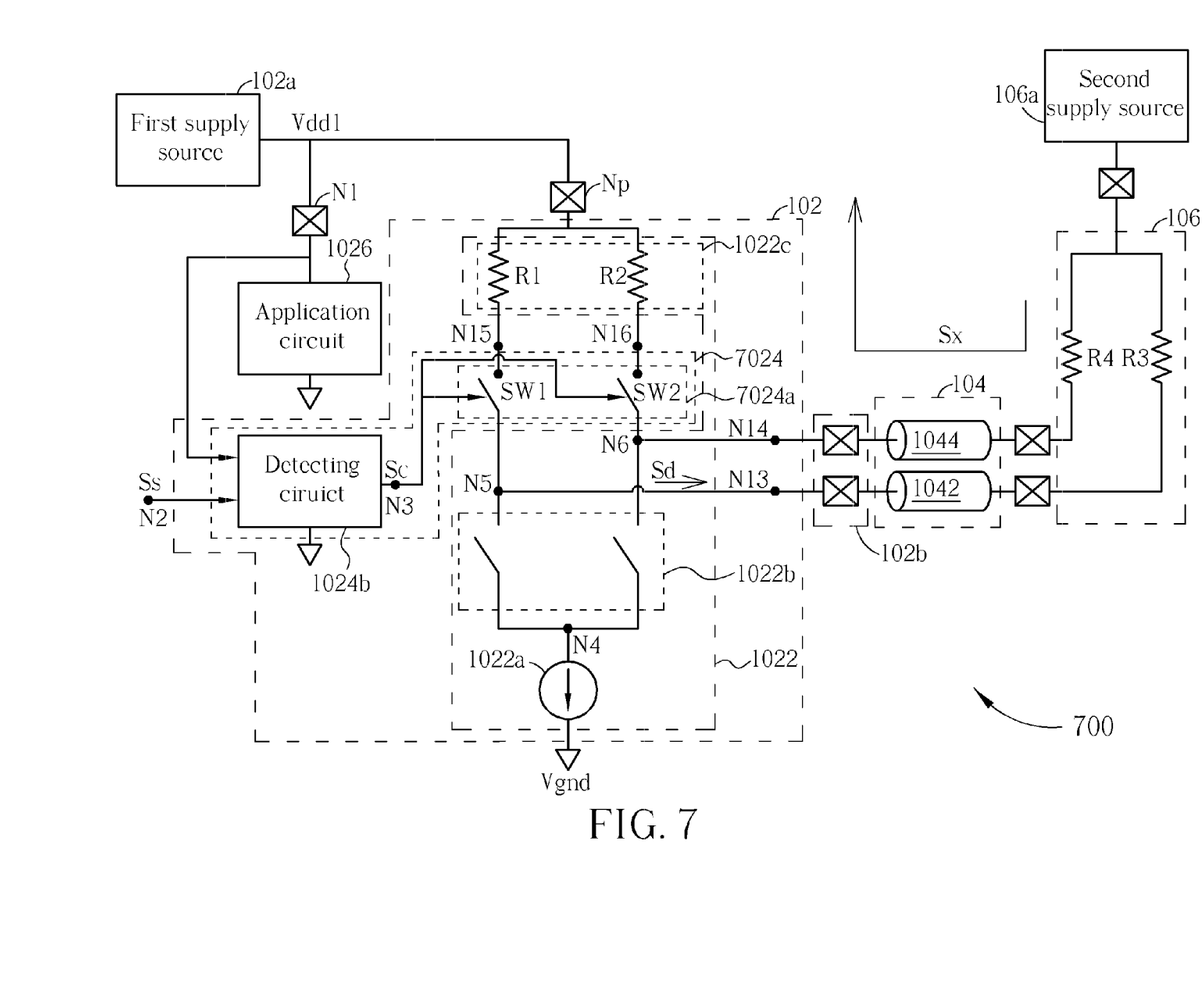
FIG. 7 is a diagram illustrating a signal transmitting system according to a fifth embodiment of the present invention.

Please refer to FIG. 7. FIG. 7 is a diagram illustrating a signal transmitting system 700 according to a fifth embodiment of the present invention. Please note that the signal transmitting system 700 has components similar to the signal transmitting system 100 except for the connecting relationship between the driver 7022 and the switching circuit 7024a. Therefore, the components in the signal transmitting system 700 that are labeled with the same numeral as the components in the signal transmitting system 100 possess similar functions to the corresponding components in the signal transmitting system 100. The detailed description is therefore omitted here for brevity.

According to the signal transmitting system 700, the driver 7022 also comprises the current source 1022a, the input circuit 1022b, and the matching circuit 1022c, and the switching circuit 7024a also comprises the first switch SW1 and the second switch SW2. The current source 1022a has a first node coupled to the ground voltage Vgnd. The input circuit 1022b has a first node coupled to a second node of the current source, and a second node and a third node coupled to a first node N13 and a second node N14 of the output port 102b, respectively. The matching circuit 1022c has a first node and a second node coupled to the power supply node Np. The first switch SW1 has a first node coupled to the second node of the input circuit 1022b, a second node coupled to a third node N15 of the matching circuit 1022c, and a control node coupled to the output node N3 of the detecting circuit 1024b, wherein the first switch SW1 is arranged to selectively connect the first node of the first switch SW1 to the second node of the first switch SW1 or disconnect the first node of the first switch SW1 from the second node of the first switch SW1 according to the control signal Sc. The second switch SW2 has a first node coupled to the third node of the input circuit 1022b, a second node coupled to a fourth node N16 of the matching circuit 1022c, and a control node coupled to the output node N3 of the detecting circuit 1024b, wherein the second switch SW2 is arranged to selectively connect the first node of the second switch SW2 to the second node of the second switch SW2 or disconnect the first node of the second switch SW2 from the second node of the second switch SW2 according to the control signal Sc.

Therefore, when the detecting circuit 1024b detects that the first supply source 102a is powered on, the detecting circuit 1024b generates the control signal Sc to switch on the first switch SW1 and the second switch SW2. When the first supply source 102a is powered off and the receiving stage 106 still keeps being powered by the second supply source 106a, and when the voltage level at the first input node N1 reaches the predetermined voltage level vp2, the detecting circuit 1024b gets enough power to output the control signal Sc to switch off the switching circuit 7024a to disconnect the conducting path between the first supply source 102a and the output port 102b. Therefore, the conducting path between the first supply source 102a and the output port 102b is disconnected, and the external signal Sx is blocked from the application circuit 1026.

Figure 8:
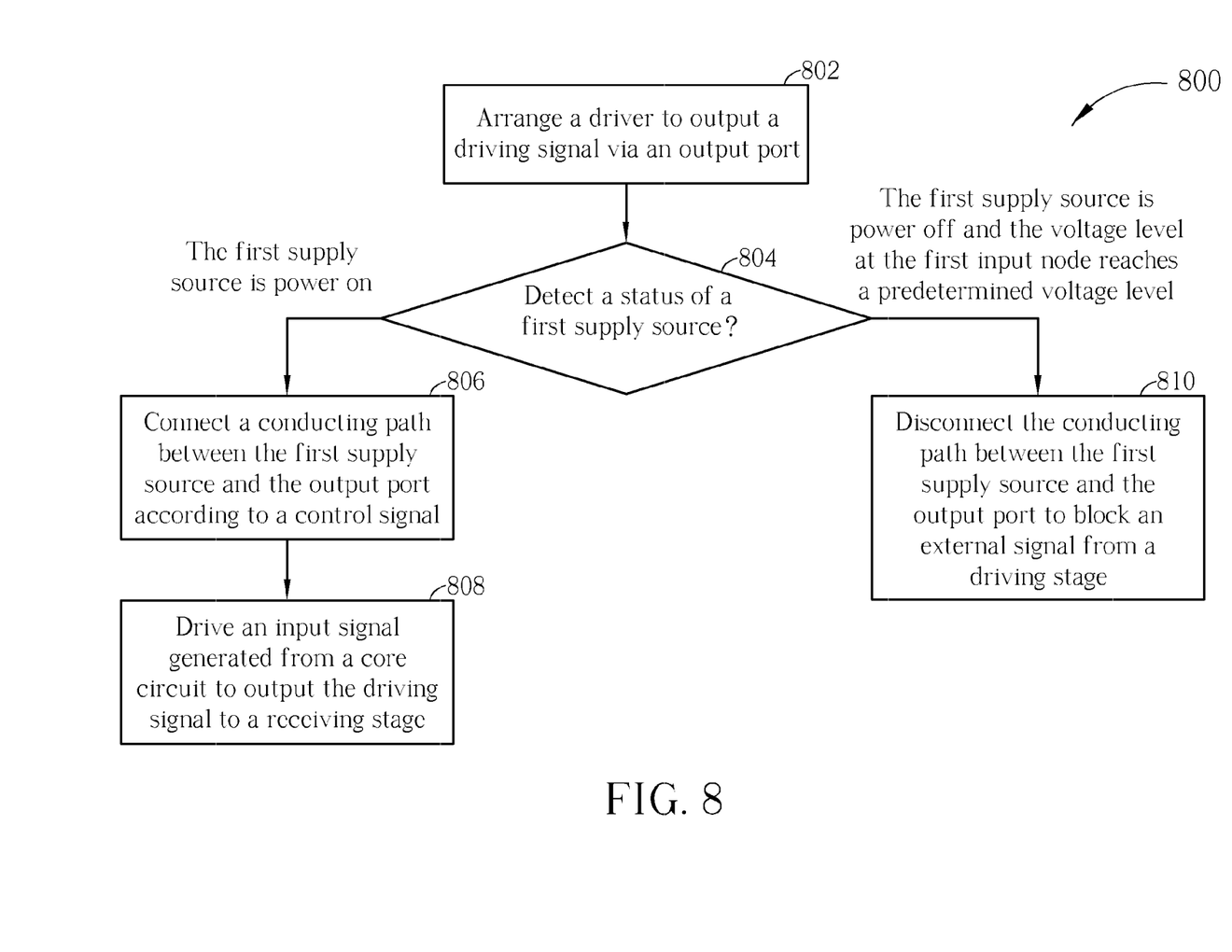
FIG. 8 is a flowchart illustrating a driving method for a driving stage according to a sixth embodiment of the present invention.

Please refer to FIG. 8. FIG. 8 is a flowchart illustrating a driving method 800 for a driving stage according to a sixth embodiment of the present invention, wherein the driving stage comprises a driver powered by a first supply source. For simplicity, the driving stage referenced here can be the driving stage 102 of the above mentioned embodiments. Provided that substantially the same result is achieved, the steps of the flowchart shown in FIG. 8 need not be in the exact order shown and need not be contiguous, that is, other steps can be intermediate. The driving method 800 comprises the steps:

Step 802: Arrange the driver 1022 to output the driving signal Sd via the output port 102b;

Step 804: When the first supply source 102a is powered on, go to step 806; when the first supply source 102a is powered off and the voltage level at the first input node N1 is charged by the external signal Sx and reaches the predetermined voltage level vp2, go to step 810;

Step 806: Connect the conducting path between the first supply source 102a and the output port 102b according to the control signal Sc;

Step 808: Drive the input signal Sin generated from the core circuit 102c to output the driving signal Sd to the receiving stage 106;

Step 810: Disconnect the conducting path between the first supply source 102a and the output port 102b to block the external signal Sx from the driving stage 102.

According to the steps 802-810, when the first supply source 102a is powered on, the conducting path between the first supply source 102a and the output port 102b will be connected according to the control signal Sc for outputting the driving signal Sd to the receiving stage 106. When the first supply source 102a is powered off and the second supply source 106a is powered on, the conducting path between the first supply source 102a and the output port 102b will be disconnected to block the external signal Sx from the application circuit 1026.

Briefly, an embodiment of the present invention disposes the controllable isolating circuit comprising the switching circuit and the detecting circuit into the same chip of the driver and uses the external leakage current to power the controllable isolating circuit to selectively disconnect the conducting path between the first supply source and the output port to avoid erroneous activation of the application circuit.

Those skilled in the art will readily observe that numerous modifications and alterations of the device and method may be made while retaining the teachings of the invention.

What is claimed is:

1. A driving stage of a signal transmitting system, comprising:
a driver, powered by a first supply source and arranged to output a driving signal via an output port arranged to connect to an external device; and
a controllable isolating circuit, comprising:
a switching circuit, arranged to selectively couple the first supply source to the output port; and
a detecting circuit, arranged to detect a specific signal derived from the signal transmitting system and to detect an external signal generated from a second supply source of the external device;
wherein the external signal flows through the output port and the switching circuit to reach the detecting circuit, when the specific signal indicates the signal transmitting system turns into a power-off state and the external signal indicates the second supply source is a power-on state, the detecting circuit controls the switching circuit to disconnect the output port from the first supply source to avoid an erroneous activation of an application circuit in the signal transmitting system under the power-off state.

2. The driving stage of claim 1, wherein the driver is a Transition Minimized Differential Signaling (TMDS) driver.

3. The driving stage of claim 1, wherein the driver and the controllable isolating circuit are disposed in a same chip.

4. The driving stage of claim 1, wherein the controllable isolating circuit is powered by the external signal received from the external device through the output port.

5. The driving stage of claim 4, wherein the controllable isolating circuit is powered by the external signal when the signal transmitting system turns into the power-off state, and the controllable isolating circuit is powered by the first supply source before the signal transmitting system turns into the power-off state.

6. The driving stage of claim 1, wherein the specific signal is a voltage level of a core power of the signal transmitting system.

7. The driving stage of claim 1, wherein the switching circuit is an isolable termination, a power switch or an I/O switch.

8. The driving stage of claim 1, wherein the power-off state is a sleep-mode state, a low-power state, or a standby mode state of the signal transmitting system.

9. The driving stage of claim 1, wherein the driver is coupled to the first supply source via a power supply node of the driving stage; the detecting circuit has a first input node coupled to the power supply node, a second input node receiving the specific signal, and an output node coupled to the switching circuit for outputting a control signal for controlling the switching circuit.

10. The driving stage of claim 1, wherein the specific signal is generated from a specific power source powered by the first supply source.

11. The driving stage of claim 10, wherein the driver outputs the driving signal according to an input signal generated from a core circuit which is powered by the specific power source.

12. The driving stage of claim 1, wherein the driver comprises:
a current source, having a first node coupled to a third supply source;
an input circuit, having a first node coupled to a second node of the current source, and a second node and a third node coupled to a first node and a second node of the output port, respectively; and
a matching circuit, having a first node and a second node coupled to the second node and the third node of the input circuit, respectively; and
the switching circuit comprises:
a first switch, arranged to selectively connect a third node of the matching circuit to the first supply source or disconnect the third node of the matching circuit from the first supply source according to a control signal generated by the specific signal; and
a second switch, arranged to selectively connect a fourth node of the matching circuit to the first supply source or disconnect the fourth node of the matching circuit to first supply source according to the control signal.

13. The driving stage of claim 1, wherein the driver comprises:
a current source, having a first node coupled to a third supply source;
an input circuit, having a first node coupled to a second node of the current source, and a second node and a third node coupled to a first node and a second node of the output port, respectively; and
a matching circuit, having a first node and a second node coupled to the second node and the third node of the input circuit, respectively; and
the switching circuit comprises:
a switch, arranged to selectively connect a third node and a fourth node of the matching circuit to the first supply source or disconnect the third node and the fourth node of the matching circuit from the first supply source according to a control signal generate by the detecting circuit.

14. The driving stage of claim 1, wherein the driver comprises:
a current source, having a first node coupled to a third supply source;
an input circuit, having a first node coupled to a second node of the current source; and
a matching circuit, having a first node and a second node coupled to a second node and a third node of the input circuit, respectively, and a third node and a fourth node coupled to the first supply source; and
the switching circuit comprises:
a first switch, arranged to selectively connect the first node of the matching circuit to a first node of the output port or disconnect the first node of the matching circuit from the first node of the output port according to a control signal generated by the detecting circuit; and
a second switch, arranged to selectively connect the second node of the matching circuit to a second node of the output port or disconnect the second node of the matching circuit from the second node of the output port according to the control signal.

15. The driving stage of claim 1, wherein the driver comprises:
a current source, having a first node coupled to a third supply source;
an input circuit, having a first node coupled to a second node of the current source, and a second node and a third node coupled to a first node and a second node of the output port, respectively; and
a matching circuit, having a first node and a second node coupled to the first supply source; and
the switching circuit comprises:
a first switch, arranged to selectively connect the second node of the input circuit to a third node of the matching circuit or disconnect the second node of the input circuit from the third node of the matching circuit according to a control signal generated by the detecting circuit; and
a second switch, arranged to selectively connect the third node of the input circuit to a fourth node of the matching circuit or disconnect the third node of the input circuit from the fourth node of the matching circuit according to the control signal.

16. A driving stage, comprising:
a driver, powered by a first supply source and arranged to output a driving signal via an output port; and
a controllable isolating circuit, arranged for interrupting a conducting path between the first supply source and the output port under a condition where a power powered by the first supply source is lower than a power level indicative of the driver turns into a power-off state and a second supply source externally coupled to the output port is a power-on state;
wherein the driver and the controllable isolating circuit are disposed in a same chip, and when the driver turns into the power-off state and an external signal flowing through the output port and the conducting path indicates the second supply source is the power-on state, the controllable isolating circuit interrupts the conducting path between the first supply source and the output port to avoid an erroneous activation of an application circuit coupled to the first supply source.

17. The driving stage of claim 16, wherein the driver is a Transition Minimized Differential Signaling (TMDS) driver.

18. The driving stage of claim 16, wherein the controllable isolating circuit is powered by the signal received from the output port.

19. The driving stage of claim 18, wherein the controllable isolating circuit is powered by the signal received from the output port when the signal transmitting system turns into the power-off state, and the controllable isolating circuit is powered by the first supply source before the signal transmitting system turns into the power-off state.

20. The driving stage of claim 16, wherein when the power-off state comprises a sleep-mode state, a low-power state, or a standby mode state of the signal transmitting system.

21. A driving method for a driving stage of a signal transmitting system, wherein the driving stage comprises a driver powered by a first supply source, and the driving method comprises:
arranging the driver to output a driving signal via an output port arranged to connect to an external device;
selectively coupling the first supply source to the output port through a switching circuit;
detecting a specific signal derived from the signal transmitting system; and
detecting an external signal generated from a second supply source of the external device, wherein the external signal flows through the output port and the switching circuit, when the specific signal indicates the signal transmitting system turns into a power-off state and the external signal indicates the second supply source is a power-on state, controlling the switching circuit to disconnect the output port from the first supply source to avoid an erroneous activation of an application circuit in the signal transmitting system under the power-off state.

22. The driving method of claim 21, wherein the specific signal is a voltage level of a core power of the signal transmitting system.

23. The driving method of claim 21, wherein the switching circuit is an isolable termination, a power switch or an I/O switch.

24. The driving method of claim 21, wherein the power-off state is a sleep-mode state, a low-power state, or a standby mode state of the signal transmitting system.

25. The driving method of claim 21, wherein the specific signal is generated from a specific power source powered by the first supply source.

26. The driving method of claim 25, wherein the driver outputs the driving signal according to an input signal generated from a core circuit which is powered by the specific power source.

27. A driving stage, comprising:
a driver, powered by a first supply source and arranged to output a driving signal via an output port; and
a controllable isolating circuit, arranged for interrupting a conducting path between the first supply source and the output port according to a state of the driver and a state of a second supply source, wherein the state of the second supply source is indicated by an external signal flowing through the output port and the conducting path.

* * * * *